(12) United States Patent
Blanding et al.

(10) Patent No.: US 7,265,361 B2
(45) Date of Patent: Sep. 4, 2007

(54) BEAM BLANKER DRIVER SYSTEM AND METHOD

(75) Inventors: Curt Blanding, San Jose, CA (US); Scott C. Stovall, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 189 days.

(21) Appl. No.: 11/236,885

(22) Filed: Sep. 28, 2005

(65) Prior Publication Data

US 2007/0069148 A1    Mar. 29, 2007

(51) Int. Cl.
*H01J 37/47* (2006.01)
*B01D 15/08* (2006.01)

(52) U.S. Cl. .................. 250/396 R; 250/306; 250/307; 250/492.22; 250/492.3

(58) Field of Classification Search ...................... None
See application file for complete search history.

(56) References Cited

U.S. PATENT DOCUMENTS

| | | | |
|---|---|---|---|
| 4,661,709 A | 4/1987 | Walker et al. .......... | 250/396 R |
| 4,833,445 A | 5/1989 | Buchele .................. | 341/118 |
| 5,144,225 A | 9/1992 | Talbot et al. ............. | 324/73.1 |
| 5,210,487 A | 5/1993 | Takahashi et al. ....... | 324/158 R |
| 5,270,643 A | 12/1993 | Richardson et al. .... | 324/158 R |
| 5,585,691 A | 12/1996 | Washburn ................ | 313/452 |
| 5,691,541 A | 11/1997 | Ceglio et al. ............ | 250/492.1 |
| 5,847,959 A | 12/1998 | Veneklasen et al. ... | 364/468.28 |
| 6,051,839 A | 4/2000 | Crewe .................. | 250/396 ML |
| 6,163,159 A | 12/2000 | Seyama .................. | 324/751 |
| 6,410,923 B1 | 6/2002 | Crewe .................. | 250/396 ML |
| 6,465,796 B1 | 10/2002 | Haraguchi et al. ..... | 250/492.23 |
| 6,584,609 B1 | 6/2003 | Pierrat et al. ............ | 716/19 |
| 6,593,584 B2 | 7/2003 | Krans et al. ............ | 250/492.2 |
| 6,617,595 B1 | 9/2003 | Okunuki ................. | 250/492.22 |
| 2002/0148971 A1 | 10/2002 | Sogard ................... | 250/396 R |

*Primary Examiner*—Nikita Wells
(74) *Attorney, Agent, or Firm*—Shirley L. Church

(57) ABSTRACT

A particle beam lithography system and method of blanking a beam such as a particle or other beam. The system may include a frequency divider adapted to convert a master clock signal at a first frequency into an integral number N of waveforms at a second frequency, a reference device adapted to provide a fixed threshold reference signal, a sequencer adapted to provide N sets of data, a blanking circuit for each of the waveforms for creating a blanking signal for each of the waveforms, and a logic circuit for combining each of the blanking signals from each of the blanking circuits. The blanking circuit may include a digital to analog converter adapted to receive one of the N sets of data from the sequencer and to generate a variable threshold reference signal and a window comparator adapted to receive one of the waveforms, the fixed threshold reference signal, and the variable threshold reference signal and to generate a blanking signal.

27 Claims, 3 Drawing Sheets

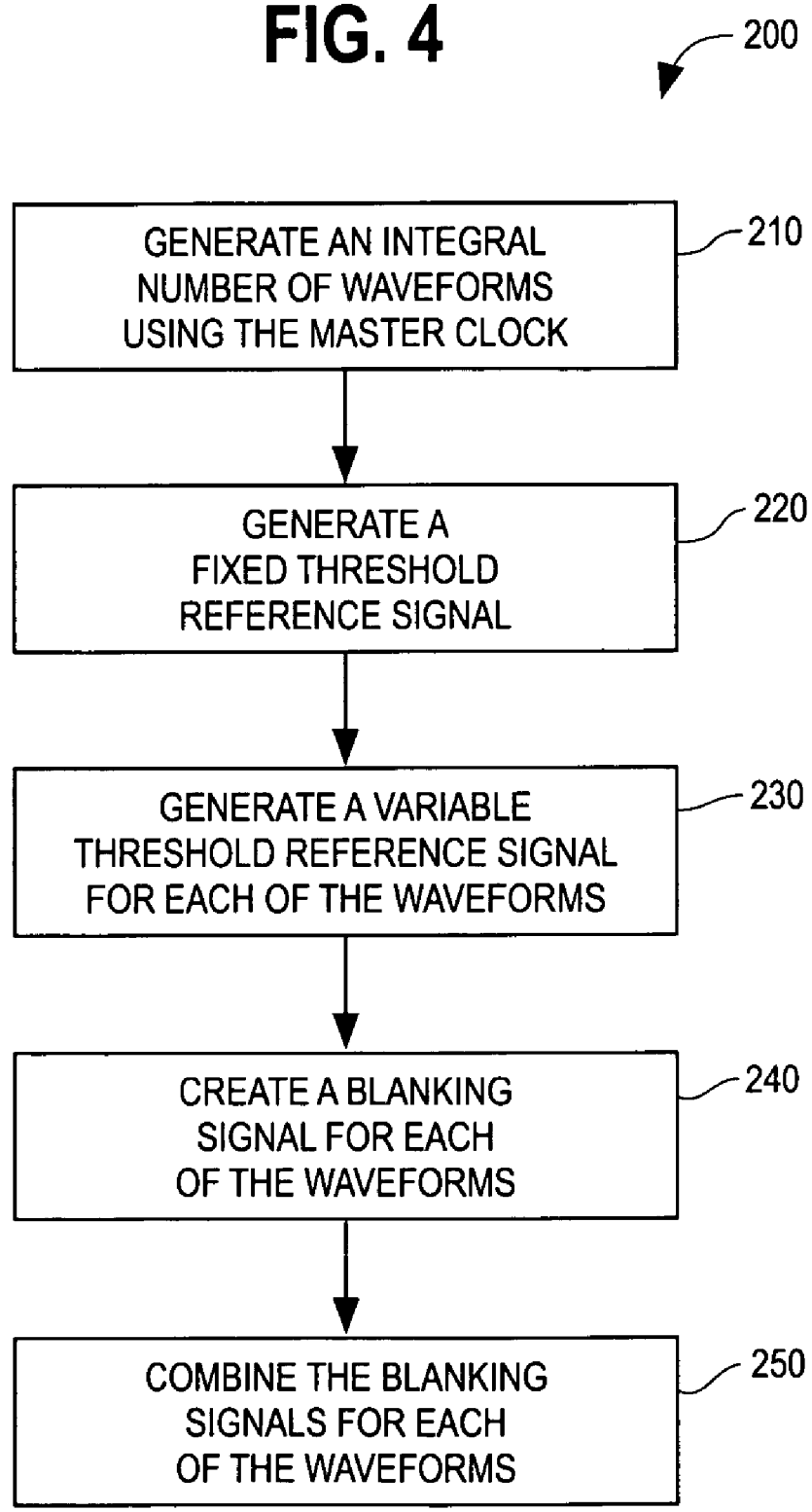

BEAM BLANKER DRIVER SYSTEM AND METHOD

BACKGROUND OF THE INVENTION

1. Field of the Invention

The present invention relates in general to blanker driver system and method for beams such as particle or other beams. It more particularly relates to a blanker driver system and method, which may be used for systems such as particle beam lithography.

2. Background Art

There is no admission that the background art disclosed in this section legally constitutes prior art.

In a particle beam based pattern writing system, the writing process involves exposing a sample to the beam. A mechanism of blanking the beam is incorporated for situations in which it is required that the sample not be exposed to the beam. The writing process typically involves executing a sequence of consecutive exposure intervals, synchronized to a master clock. During each of the exposure intervals, the beam may be blanked or exposed for a programmable period of time. Precise, high resolution control of the exposure time within each interval is required in order to ensure high fidelity of the written pattern. High resolution delay lines, combined with appropriate logic circuitry are typically used to implement such timing control circuitry. However, this approach has several disadvantages, such as overcoming the inherent asynchronous delay associated with such devices, as well as the limited ability to scale such an implementation to medium-high speed clock rates, e.g. on the order of 1 GHz master clock frequency.

Variable-width pulses in a system with fixed interval timing can be generated by using a high frequency clock, whose period is much shorter than the fixed interval period, in combination with some counter logic. The logic can be programmed to provide an output pulse of a width equivalent to a programmable number of periods of the high-frequency clock. This approach does not extend to high resolution pulse width control, e.g. in order to achieve a timing resolution such as a 2.5 picoseconds timing resolution, because a high-frequency clock of 400 GHz would be required, and would be impractical.

At higher frequencies, delay lines are typically used, again in conjunction with some gating logic. The reference exposure clock can be combined with a delayed version of itself to generate a variable width pulse. A typical example of the use of delay lines is shown in FIG. 1.

Commercially available programmable delay lines are available with resolution on the order of 10 picoseconds steps. However there are several problems with this approach.

In a pattern writing instrument, successive exposure times are independently variable. Thus a programmable delay line device used in the manner described above must be reprogrammed between exposure clocks. Considering the various timing considerations associated with this programming process (setup, hold, and propagation delay of several nanoseconds) it is clear that a single delay line cannot be used to generate arbitrarily programmable delays on successive clock cycles. Thus a "ping-ponging" approach must be used with appropriate logic to switch between alternate delay lines. Furthermore, the number of additional delay lines required depends on the absolute delay through the device compared to the exposure clock period.

Resolution of 10 picoseconds is inadequate to achieve the level of exposure timing control required in the next generation of high speed mask writing instruments. For example if the exposure clock period is 2.5 nanoseconds, and a Minimum Blanking Interval between successive exposures is 20%, then 0.5 nanoseconds is reserved, and the resolution of exposure control using a typical state-of-the-art delay line would be 10 picoseconds/2.0 nanoseconds which equals 1 part in 200, or 0.5%. Performance targets for the next generation of high speed mask writing instruments indicate that this is inadequate.

The minimum absolute delay through a typical delay line device is on the order of several nanoseconds. In a synchronous system with a master exposure clock, special timing adjustments must be made in order to compensate for this asynchronous minimum delay through the device. Furthermore, if multiple delay line devices are required, as indicated above, then part-to-part skew must also be calibrated out.

As gating logic is required to combine the leading edge of one signal with the falling edge of another in order to generate the variable pulse-width (FIG. 1), the output pulse-width is susceptible to timing jitter between the two different paths taken prior to combination.

A problem exists in creating blanking signals for the beam of a particle beam column when increasing the flash rate for the next generation of beam lithography devices. A system and method is needed to create the blanking circuit to overcome these difficulties.

BRIEF DESCRIPTION OF THE DRAWINGS

The features of this invention and the manner of attaining them will become apparent, and the invention itself will be best understood by reference to the following description of certain embodiments of the invention taken in conjunction with the accompanying drawings, wherein:

FIG. 4 is a flow chart of an embodiment of a method of creating a blanking signal line for a particle beam column according to the present invention.

DESCRIPTION OF CERTAIN EMBODIMENTS OF THE INVENTION

Figure 1:
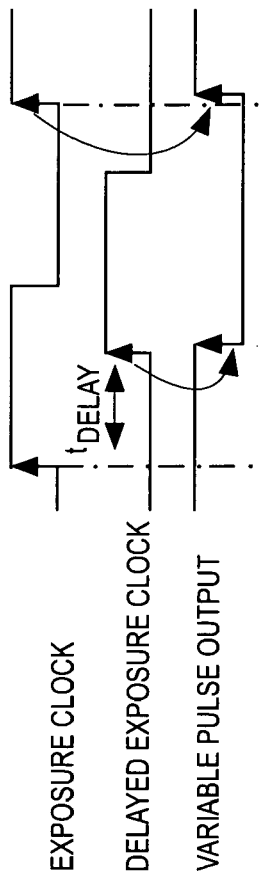
FIG. 1 is a timing diagram of an example of a prior art delay line.

It will be readily understood that the components of the embodiments as generally described and illustrated in the drawings herein, could be arranged and designed in a wide variety of different configurations. Thus, the following more detailed description of the embodiments of the system, components and method of the present invention, as represented in the drawings, is not intended to limit the scope of the invention, as claimed, but is merely representative of the embodiments of the invention.

A system and method is disclosed for blanking a beam such as a particle or other beam. According to an embodiment of the invention, the disclosed blanker circuit may include a frequency divider adapted to convert a master clock signal at a first frequency into an integral number N of waveforms at a second frequency, a reference device adapted to provide a fixed threshold reference signal, a sequencer adapted to provide N sets of data, a waveform blanking circuit for each of the waveforms for creating a blanking signal for each of the waveforms, and a logic circuit for combining each of the blanking signals from each of the waveform blanking circuits. The waveform blanking circuit may include a digital to analog converter adapted to receive one of the N sets of data from the sequencer and to generate a variable threshold reference signal and a window comparator adapted to receive one of the waveforms, the fixed threshold reference signal, and the variable threshold reference signal and to generate a blanking signal.

In accordance with another disclosed embodiment of the invention, there is provided a method of generating a blanking signal line for a particle beam column having a clock at frequency f comprising generating an integral number N of waveforms each having a frequency of f/N; generating a fixed threshold reference signal; generating a variable threshold reference signal for each of the waveforms; creating a blanking signal for each waveform using the specific waveform, the fixed threshold reference signal, and the variable threshold reference signal for the specific waveform; and combining the blanking signals for each of the waveforms to create the blanking signal line.

According to another aspect of a disclosed embodiment of the invention, there is provided a system for generating a blanking signal line for a particle beam column having a clock at frequency f, comprising means for generating an integral number N of waveforms each having a frequency of f/N; means for generating a fixed threshold reference signal; means for generating a variable threshold reference signal for each of the waveforms; means for creating a blanking signal for each of the waveforms using the waveform, the fixed threshold reference signal, and the variable threshold reference signal for the specific waveform; and means for combining the blanking signals for each of the waveforms to create the blanking signal line.

Figure 2:
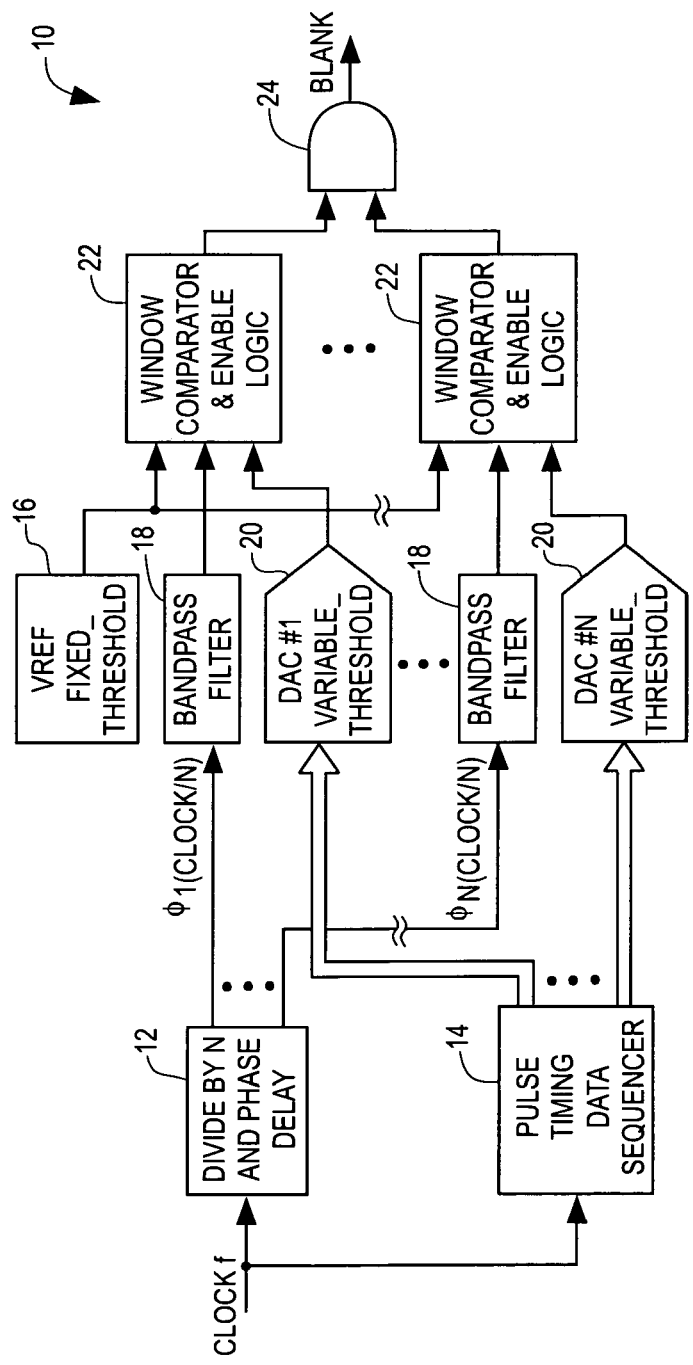
FIG. 2 is an embodiment of a blanking circuit for a particle beam lithography device according to the present invention.

Referring to FIG. 2, an embodiment of a blanking circuit is shown. The blanking circuit 10 may include a waveform creating device 12, a sequencer 14, a DC voltage reference generator 16 providing a fixed threshold reference signal, a plurality of band-pass filters 18, a plurality of digital to analog converters (DAC) 20 for generating a plurality of variable threshold reference signals, a plurality of window comparators 22, and a logic device 24.

The waveform creating device 12 may generate an integral N of waveforms using the master exposure clock having a frequency of f. The master exposure clock frequency f may be the rate at which output pulses are to be generated. The frequency of each of the waveforms may be f/N. The waveforms may be delayed from one another by a phase difference of $2\pi/N$, such that individual waveforms may have phase delays of $2\pi/N$, $2*2\pi/N$, ... $(N-1)* 2\pi/N$, respectively. These waveforms are shown as $\phi_{1(Clock/N)}$ ... $\phi_{N(Clock/N)}$.

The sequencer 14 may provide digital pulse timing data to each of the DACs 20 a clock rate of f/N. The data may contain the value for each of the variable threshold reference signals and timed to allow each variable threshold reference signal to settle prior to its use as a reference signal.

Each of the N waveforms may include a waveform blanking circuit that may include one of the band-pass filters 18, one of the DACs 20, and one of the window comparator circuits 22. The band-pass filter 18 may be used to generate a clean sine waveform of frequency f/N. The DAC 20 may receive digital pulse timing data at a clock rate of f/N, thereby generating a synchronous variable voltage threshold. The window comparator circuit 22 may generate a pulse or blanking signal for the time during which the instantaneous voltage level of the clean sine waveform exceeds the voltage at the output of the DAC, i.e. the variable threshold, but is less than the voltage reference, i.e. the fixed threshold.

The logic device 24 may combine the individual pulses or blanking signals from each of the N waveform blanking circuits into an output stream that provides pulses at an aggregate rate of master clock frequency f. These pulses may establish the exposure times for the beam column. An arbitrary minimum blanking interval between successive pulses may be established.

Figure 3:
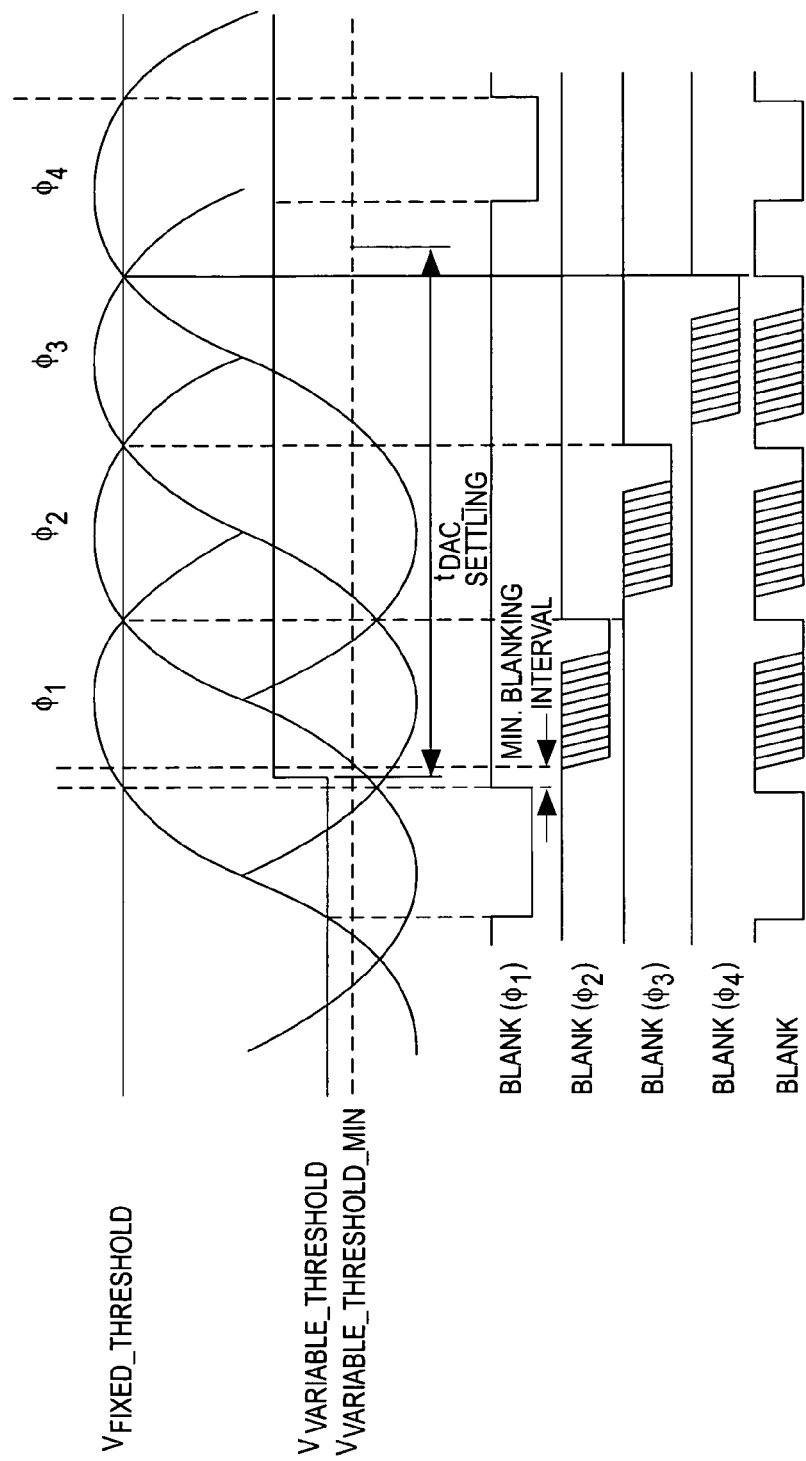
FIG. 3 is a timing diagram for the blanking circuit of FIG. 2.

Referring now to FIG. 3, a timing diagram for the blanking circuit of FIG. 2 is shown. The sine waveform $\phi1$ may be applied to a high speed window comparator with upper limit $V_{Fixed\_Threshold}$ provided by the DC voltage reference generator and lower limit $V_{variable\_Threshold}$ provided by the DAC 20 for waveform $\phi1$. Intermediate signal Blank ($\phi1$) may transition to a low state when sine waveform $\phi1$ exceeds the variable threshold voltage, but is less than the fixed threshold voltage. Intermediate signal Blank ($\phi1$) may transition to a high state when sine waveform $\phi1$ exceeds the fixed threshold voltage. Some time after the sine waveform $\phi1$ exceeds the fixed threshold voltage, the variable threshold for waveform $\phi1$ may be changed to a new value and allowed to settle while blank pulses for waveforms $\phi2$, $\phi3$, and $\phi4$ may be generated by similar circuits. Note that in this manner, the settling time requirement for the variable threshold DAC to reach the desired value may be extended to $(N-1)/f$. Then the next Blank ($\phi1$) signal may be generated. Output logic may combine signals Blank($\phi1$), Blank($\phi2$), Blank($\phi3$), and Blank($\phi4$) to generate the output signal Blank as shown.

The following discussion calculates the achievable timing resolution for the circuit of FIG. 2. Since the sine waveform is non-linear, the differential timing resolution ($\Delta T$) for an incremental change in DAC value ($\Delta V$) may vary over the range of available DAC values. The worst case timing resolution occurs where the slope of the sine wave is at a minimum. Thus the worst case timing resolution achievable ($\Delta T_{max}$) may be determined by calculating the time difference between the minimum threshold amplitude and the minimum threshold value plus one least significant bit (LSB).

The calculation for the relevant angular information for sine waveforms is as follows:

The phase delay between waveforms is $2\pi/N$ radians.

If no minimum blanking interval is imposed, the active portion used for timing control for a given sine waveform is $-\pi/N$ to $+\pi/N$.

Allowing a minimum blanking interval to be imposed between successive pulses, let the percentage of the clock period that can be actively utilized be denoted by variable A. For example, if the minimum blanking interval is 20%, then the active portion of the output period is 80%, and A=0.8.

The active portion of a given sine waveform is then: $-A\pi/N$ to $+A\pi/N$.

The calculation of the amplitudes corresponding to the minimum and maximum thresholds, and amplitude of one LSB of the variable threshold DAC may be as follows:

Amplitude for Minimum Threshold=$\sin(-A\pi/N)$

Amplitude for Maximum Threshold=$\sin(+A\pi/N)$

For a Variable Threshold DAC with a resolution of n bits, the amplitude of 1 LSB is given by:

$$LSB\,Amplitude = \frac{1}{2^n}\left(\sin\left(+\frac{A\pi}{N}\right) - \sin\left(-\frac{A\pi}{N}\right)\right)$$
$$= \frac{1}{2^n}\left(2\sin\left(\frac{A\pi}{N}\right)\right)$$
$$= \frac{1}{2^{n-1}}\left(\sin\left(\frac{A\pi}{N}\right)\right)$$

Next, the calculation of the angular displacement between the (Minimum Threshold) and the (Minimum Threshold+1 LSB) to find the worst case timing resolution $\Delta T_{max}$ is as follows:

The angular displacement corresponding to the Min Threshold=$\omega t_1$ and $\omega t_1 = -A\pi/N$ radians.

The angular displacement corresponding to (Min Threshold amplitude plus one LSB) of the Variable Threshold DAC is:

$$\omega t_2 = \sin^{-1}\left(-\frac{A\pi}{N}\right) + \frac{1}{2^{n-1}}\sin\left(\frac{A\pi}{N}\right)\text{ radians}$$
$$= \sin^{-1}\left(\left(\frac{1}{2n-1} - 1\right)\sin\left(\frac{A\pi}{N}\right)\right)\text{ radians}$$

Then, subtracting $\omega t_1$ from the above equation gives the following:

$$\omega(t_2 - t_1) = \sin^{-1}\left(\left(\frac{1}{2n-1} - 1\right)\sin\left(\frac{A\pi}{N}\right)\right) - \left(-\frac{A\pi}{N}\right)$$
$$(t_2 - t_1) = \frac{\left(\left(\frac{A\pi}{N}\right) + \sin^{-1}\left(\left(\frac{1}{2^{n-1}} - 1\right)\sin\left(\frac{A\pi}{N}\right)\right)\right)}{\omega}$$

Substituting for $\omega = 2\pi f/N$ results in the following equation:

$$\Delta T_{max} = \frac{\left(\left(\frac{A\pi}{N}\right) + \sin^{-1}\left(\left(\frac{1}{2^{n-1}} - 1\right)\sin\left(\frac{A\pi}{N}\right)\right)\right)}{2\pi\left(\frac{f}{N}\right)}$$

As an example, for the case of:

| | |
|---|---|
| Sine wave amplitude scaled to | ±1 |
| Master Clock Frequency: | 400 MHz |
| Divisor N | 4 |
| Minimum Blanking Interval | 20% |
| Variable Threshold DAC resolution | 10 bits |

The worst case timing resolution for this example may be given as:

$$\Delta T_{max} = \frac{\left(\left(\frac{A\pi}{N}\right) + \sin^{-1}\left(\left(\frac{1}{2^{n-1}} - 1\right)\sin\left(\frac{A\pi}{N}\right)\right)\right)}{2\pi\left(\frac{f}{N}\right)}$$

-continued $$= \frac{\left(\left(\frac{0.8\pi}{4} + \sin^{-1}\left(\left(\frac{1}{2^{10-1}} - 1\right)\sin\left(\frac{0.8\pi}{4}\right)\right)\right)\right)}{2\pi\left(\frac{400 \times 10^6}{4}\right)}$$
$$= 2.26\text{ picoseconds}$$

Using this worst case timing resolution, the worst case resolution of exposure control using this example would be 2.26 picoseconds/2.0 nanoseconds or approximately 0.1%.

The amplitude sensitivity of one LSB of the variable threshold DAC may be $\frac{1}{2^n}$ of the full scale sine wave amplitude. Therefore the overall signal to noise ratio (SNR) requirement may be on the order of $2^n$:1.

Considering the example given above where $\Delta T_{max}$=2.26 picoseconds may be achieved for a DAC of n=10. Placing a requirement for the circuit noise to be less than ½ LSB, then the required SNR equals 2048:1. This signal to noise ratio may be achieved since the fixed voltage reference may be a DC voltage that may be heavily low-pass filtered, the variable threshold DAC output may be filtered at approximately f/N and that the pass-band of the band-pass filter applied to the sine waveform may be kept to a minimum.

In addition to the benefit that the relative insensitivity to noise provides to jitter performance, the concept may provide another means of reducing the output timing sensitivity to circuit jitter. Though small, there may be some relative timing jitter between the N waveforms $\phi_1, \ldots \phi_N$ with respect to the master exposure clock frequency f. Note that if waveform $\phi_N$ has a timing displacement with respect to the master exposure clock due to some long-term timing jitter, then the leading and trailing edges of the resulting blanking pulse may be offset by this amount. Thus the absolute placement of the resulting output pulse within the exposure interval may be displaced as a result of this jitter; however the pulse width, which may be of primary importance as it controls exposure time, may be unchanged. Short-term jitter over the time for one clock phase may be small.

As described above, the settling time requirement for the variable threshold DAC to reach the desired value may be extended to (N−1)/f. For example, in the case of f=400 MHz and N=4, then $t_{settling}$=7.5 nanoseconds. This settling time may be achieved with several commercially available DACs, e.g. (a) Rockwell Scientific RDA012, 12-bit 1 GS/s DAC; (b) Fujitsu MB86064, 14-bit, 1 GS/s DAC; (c) Euvis DA601, 12-bit 2 GSPS DAC; (d) TelAsic TC240114-bit, 1 GSPS DAC; each of which have sub-nanosecond settling times.

It is envisioned that higher frequency clock or exposure rates may be supported by increasing the integral or divisor N, thereby reducing the performance requirements for the individual sub-circuit channels in order to ensure that each channel remains realizable with commercially available components. The resolution of the variable threshold DAC may be varied to provide better resolution in timing control. The minimum blanking time between successive exposures may be varied. A ramp or some other well-controlled waveform may be used instead of a sine wave. A common fixed threshold voltage may be applied to all N channels, or an individual reference may be used. Various techniques of generating the N waveform phases may be employed, e.g. generating a sine wave from a divided clock, or employing PLL circuitry to generate the different phase waveforms.

Referring now to FIG. 4, an embodiment of a method of generating a blanking signal line for a particle beam column is shown and referenced as 200. At step 210 an integral number N of waveforms may be generated using a master clock having a frequency f. The frequency of each of the waveforms may be f/N. Furthermore, each waveform may be delayed by $2\pi/N$. A fixed threshold reference signal may be generated in step 220. At step 230 a variable threshold reference signal may be generated for each of the waveforms.

At step 240 a blanking signal for each waveform may be created using the particular waveform, the fixed threshold reference signal, and the variable threshold reference signal. When the waveform becomes greater than the variable threshold, the blanking signal may drop to a low state. When the waveform further increases to become greater than the fixed threshold reference signal, the blanking signal may then go to a high state. Soon after the waveform increase to greater than the fixed threshold, the variable threshold reference signal may be changed to another value. The low state of the blanking signal may represent an exposure time for a flash period of the particle beam. The exposure time may be the blanking time subtracted from the flash period time.

At step 250 the blanking signals for each of the waveforms may be combined to form the blanking signal line. Therefore, N blanking signals at a frequency of f/N may be combined to form the blanking signal line at a frequency of f.

While particular embodiments of the present invention have been disclosed, it is to be understood that various different embodiments are possible and are contemplated within the true spirit and scope of the appended claims. There is no intention, therefore, of limitations to the exact abstract or disclosure herein presented.

What is claimed is:

1. A beam blanker driver system, comprising:
    a frequency divider adapted to convert a master clock signal at a first frequency into an integral number N of waveforms at a second frequency;
    a reference device adapted to provide a fixed threshold reference signal;
    a sequencer adapted to provide N sets of data;
    a waveform blanking circuit for each of the waveforms including
        a digital to analog converter adapted to receive one of the N sets of data from the sequencer and to generate a variable threshold reference signal; and
        a window comparator adapted to receive one of the waveforms, the fixed threshold reference signal, and the variable threshold reference signal and to generate a blanking signal; and
    a logic circuit for combining each of the blanking signals from each of the waveform blanking circuits.

2. The system of claim 1, wherein the frequency of the master clock signal is at least 400 MHz.

3. The system of claim 1, wherein the second frequency is equal to the first frequency divided by N.

4. The system of claim 1, wherein a phase difference between the waveforms is $2\pi/N$.

5. The system of claim 1, wherein each waveform blanking circuit includes a band-pass filter.

6. The system of claim 1, wherein the waveforms are sine waveforms.

7. The system of claim 1, wherein the waveforms are ramp waveforms.

8. The system of claim 1, wherein the reference device is a DC voltage generator.

9. The system of claim 1, wherein the digital to analog converter includes at least ten input bits.

10. A method of generating a beam blanking signal line for a particle beam column having a clock at frequency f, comprising:
    generating an integral number N of waveforms each having a frequency of f/N;
    generating a fixed threshold reference signal;
    generating a variable threshold reference signal for each of the waveforms;
    creating a blanking signal for each of the waveforms using the waveform, the fixed threshold reference signal, and the variable threshold reference signal for the specific waveform; and
    combining the blanking signals for each of the waveforms to create the blanking signal line.

11. The method of claim 10, wherein the frequency f is at least 400 MHz.

12. The method of claim 10, wherein a phase difference between the waveforms is $2\pi/N$.

13. The method of claim 10, wherein creating a blanking signal includes changing the blanking signal to a low state when the value of the waveform increases over the variable threshold reference signal.

14. The method of claim 13, wherein creating a blanking signal includes changing the blanking signal to a high state when the value of the waveform increases over the fixed threshold reference signal.

15. The method of claim 13, wherein the low state of the blanking signal corresponds to an exposure time of the beam column.

16. The method of claim 10, wherein the waveforms are sine waveforms.

17. The method of claim 10, wherein the waveforms are ramp waveforms.

18. The method of claim 10, wherein the blanking signal line has a frequency of f.

19. A system for generating a blanking signal line for a particle beam column having a clock at frequency f, comprising:
    means for generating an integral number N of waveforms each having a frequency of f/N;
    means for generating a fixed threshold reference signal;
    means for generating a variable threshold reference signal for each of the waveforms;
    means for creating a blanking signal for each of the waveforms using the waveform, the fixed threshold reference signal, and the variable threshold reference signal for the specific waveform; and
    means for combining the blanking signals for each of the waveforms to create the blanking signal line.

20. The system of claim 19, wherein the frequency f is at least 400 MHz.

21. The system of claim 19, wherein a phase difference between the waveforms is $2\pi/N$.

22. The system of claim 19, wherein means for creating a blanking signal includes means for changing the blanking signal to a low state when the value of the waveform increases over the variable threshold reference signal.

23. The system of claim 21, wherein means for creating a blanking signal includes means for changing the blanking signal to a high state when the value of the waveform increases over the fixed threshold reference signal.

24. The system of claim 21, wherein the low state of the blanking signal corresponds to an exposure time of the beam column.

25. The system of claim 19, wherein the waveforms are sine waveforms.

26. The system of claim 19, wherein the waveforms are ramp waveforms.

27. The system of claim 19, wherein the blanking signal line has a frequency of f.

* * * * *